(12) United States Patent
Branson

(10) Patent No.: US 6,255,889 B1
(45) Date of Patent: Jul. 3, 2001

(54) MIXER USING FOUR QUADRANT MULTIPLIER WITH REACTIVE FEEDBACK ELEMENTS

(75) Inventor: Roger Branson, Flower Mound, TX (US)

(73) Assignee: Nokia Networks OY, Espoo (FI)

( * ) Notice: Subject to any disclaimer, the term of this patent is extended or adjusted under 35 U.S.C. 154(b) by 0 days.

(21) Appl. No.: 09/436,402

(22) Filed: Nov. 9, 1999

(51) Int. Cl.$^7$ ................................. G06F 7/44; G06G 7/16
(52) U.S. Cl. ........................ 327/359; 455/326; 455/333
(58) Field of Search .................................... 327/355, 356, 327/357, 358, 359; 455/326, 333

(56) References Cited

U.S. PATENT DOCUMENTS

| | | |
|---|---|---|
| 5,901,350 | 5/1999 | Stoichita et al. . |
| 5,942,929 * | 8/1999 | Aparin ................................. 327/233 |
| 6,023,196 * | 2/2000 | Ashby et al. ......................... 330/290 |

* cited by examiner

Primary Examiner—Terry D. Cunningham
Assistant Examiner—Quan Tra
(74) Attorney, Agent, or Firm—Banner & Witcoff, Ltd.; Brooke Hayes

(57) ABSTRACT

A mixer is formed from a four quadrant multiplier to include a common node, first and second cross connected differential amplifiers, a first transistor having a collector coupled to a common emitter node of the first differential amplifier and a second transistor having a collector coupled to a common emitter node of the second differential amplifier. The mixer further includes a first series feedback reactance element coupled between an emitter of the first transistor and the mixer common node and a second series feedback reactance element coupled between an emitter of the second transistor and the mixer common node. The mixer further includes a first shunt feedback reactance element coupled between a base and the collector of the first transistor, and a second shunt feedback reactance element coupled between a base and the collector of the second transistor. In an alternative embodiment of the mixer, the mixer further includes first and second output nodes, a third shunt feedback reactance element coupled between the base of the first transistor and the first output node of the mixer, and a fourth shunt feedback reactance element coupled between the base of the second transistor and the second output node of the mixer.

13 Claims, 5 Drawing Sheets

US 6,255,889 B1

MIXER USING FOUR QUADRANT MULTIPLIER WITH REACTIVE FEEDBACK ELEMENTS

BACKGROUND OF THE INVENTION

1. Field of the Invention

The present invention relates to a four quadrant multiplier used in mixers and modulators. In particular, the invention relates to feedback reactances in the multiplier used to improve the input compression point performance of the multiplier used as a mixer.

2. Description of Related Art

The gain performance of any kind of realizable transistor amplifier may be analyzed in terms of its gain in a small signal region and a large signal region. The small signal region is where the output signal has an amplitude proportional to the amplitude of the input signal and no substantial distortion occurs. However, as larger signals are input to the amplifier, certain non-linearities of transistors and circuits become more pronounced. In the extreme, a large sinusoidal signal is limited or clipped to generate an output signal rich with harmonics.

The ratio of the amplitude of the output signal to the amplitude of the large signal input (i.e., large signal gain) is no longer the same as the small signal gain. The large signal gain is less than the small signal gain, and this reduction of gain with larger signals is called compression. The input compression of an amplifier is the signal power (usually measured in dBm) that will produce a large signal gain that is 1 dB less than the small signal gain. An amplifier driven by signal powers larger than the input compression point will generate severe non-linearities and harmonics.

When amplifiers, transistors, diodes or any non-linear element are used in a mixer, a designer should consider the third order intermodulation performance as well as the input compression performance. Third order intermodulation occurs when undesired signals are input to the mixer at frequencies near the frequency of the desired signal. For example, if the desired RF signal is 1,000 MHz, undesired signals may occur at 1,002 MHz and 1,004 MHz (or at 1,003 MHz and 1,006 MHz, etc). These undesired frequencies are too close to the desired frequency to be removeable by any practical pre-mixer filter. If the amplitude of the 1,002 MHz signal were large enough to operate in the large signal region and cause second order harmonics in the mixer, this second order harmonic (i.e., 2,004 MHz) would mix with the other undesired signal (i.e., 1,004 MHz) to produce a signal at the desired signal frequency (two times 1,002 MHz less 1,004 MHz is 1,000 MHz) that is indistinguishable by frequency from the desired signal even with the most selective IF amplifier. If the amplitude of the undesired signal at 1,002 MHz where large enough to produce a second harmonic, a phantom signal at 1,004 MHz will be processed by the mixer as if it were a desired signal at 1,000 MHz. Even if there where no phantom signal, the mixer noise figure would include the thermal noise in an IF bandwidth about 1,004 MHz.

It makes little difference whether a desired signal is too large or an undesired near frequency is too large. To maintain a near distortionless mixer, a designer should ensure that the input signals have powers that are less than the input compression point.

Differential amplifiers are a basic building block used in a four quadrant multiplier known as a Gilbert cell mixer. In FIG. 1, known differential amplifier D includes first and second transistors connected at common emitter CE. Differential amplifier D receives first and second inputs IN1 and IN2 at respective bases of the first and second transistors and generates outputs OUT2 and OUT1 at respective collectors of the first and second transistors.

In FIG. 2, a known four quadrant multiplier has first and second differential amplifiers D1 and D2 in a cross connected configuration so as to receive first and second inputs IN1 and IN2 at bases of respective first and second transistors in each of the first and second differential amplifiers D1 and D2, and so as to generate output OUT2 at a collector of the first transistor of first differential amplifier D1 and generate output OUT1 at a collector of the first transistor of second differential amplifier D2. The four quadrant multiplier of FIG. 2 further includes first transistor Q1 having a collector coupled to a common emitter node of first differential amplifier D1 and second transistor Q2 having a collector coupled to a common emitter node of second differential amplifier D2. The bases of transistors Q1 and Q2 are coupled to respective third and fourth inputs IN3 and IN4. In FIG. 2, the emitters of transistors Q1 and Q2 are coupled together and to a common node of the four quadrant multiplier.

In FIG. 3, a known four quadrant multiplier has first and second cross connected differential amplifiers D1 and D2 as discussed with respect to FIG. 2, has first and second transistors Q1 and Q2 having respective collectors coupled to respective common emitter nodes of respective differential amplifiers D1 and D2 as discussed with respect to FIG. 2, and has the bases of transistors Q1 and Q2 coupled to respective third inputs IN3 and IN4 as discussed with respect to FIG. 2. However, unlike the circuit of FIG. 2, in FIG. 3, the emitters of transistors Q1 and Q2 are coupled through respective resistors R1 and R2 to a common node of the four quadrant multiplier.

In operation of the circuits of either FIG. 2 or FIG. 3, a first signal is applied differentially to inputs IN1 and IN2 and has only such "common mode" component as needed to properly bias the transistors of differential amplifiers D1 and D2. A second signal is applied differentially to inputs IN3 and IN4 and has only such "common mode" component as is needed to properly bias transistors Q1 and Q2 so as to provide a desired operating point. In such a configuration, outputs OUT1 and OUT2 provide the four quadrant multiplied product in differential form of the first and second signals. Such a circuit is commonly known as a Gilbert Cell Mixer and finds application in integrated mixers and modulators.

Key specifications for a down converting mixer in a cellular phone are typically conversion gain of 10 dB, input compression point (ICP) at least −10 dBm and a single sideband noise figure of no more than 9 dB. The conversion gain of the circuit of FIG. 2 is typically higher than desired, for example, greater than 20 dB. High conversion gain is undesirable in the multiplier mixer because output signals should be maintained at power levels below the large signal region to avoid distortion and production of third order intermodulation. To limit the output signals from high gain mixers to the small signal region, input signal powers must be maintained much lower than is desired. A design that sets the maximum input signal power equal to the input compression point for a high conversion gain mixer will have a regretably small margin over the thermal noise in the intermediate frequency bandwidth. At least a lower conversion gain mixer could set its maximum input signal power higher, and thus the margin over noise will be greater than could be achieved with a high conversion gain mixer.

In low frequency applications, resistors R1 and R2 of FIG. 3 may be inserted in the mixer circuit of FIG. 2 to reduce the conversion gain; however, at higher RF frequencies, the resulting increase in noise figure is usually not acceptable.

Radio frequencies (RF) in the modern cellular telephone environment generally refer to frequencies above 500 MHz and typically 1,000 MHz to 2,000 MHz. Known amplifiers operating at these RF frequencies sometimes employ feedback networks in order to achieve certain key performance parameters while sacrificing others. However, reactive feedback networks have not been applied to four quadrant multipliers used as RF mixers.

SUMMARY OF THE INVENTION

It is an object to the present invention to provide a mixer based on a four quadrant multiplier that has reduced conversion gain. It is a further object of the present invention to provide a mixer based on a four quadrant multiplier that can receive a greater input power signal than prior art without generating output signals that operate in the large signal region and without increasing the mixer's noise figure.

These and other objects are achieved in a mixer that includes a mixer common node, a first differential amplifier having a common emitter node, a second differential amplifier having a common emitter node, a first transistor having a collector coupled to the common emitter node of the first differential amplifier, a second transistor having a collector coupled to the common emitter node of the second differential amplifier, a first series feedback reactance element coupled between an emitter of the first transistor and the mixer common node, a second series feedback reactance element coupled between an emitter of the second transistor and the mixer common node, a first shunt feedback reactance element coupled between a base and the collector of the first transistor, and a second shunt feedback reactance element coupled between a base and the collector of the second transistor.

In an alternative embodiment of the mixer, the mixer includes a first differential amplifier having a common emitter node, a second differential amplifier having a common emitter node, a first transistor having a collector coupled to the common emitter node of the first differential amplifier, a second transistor having a collector coupled to the common emitter node of the second differential amplifier, a first shunt feedback reactance element coupled between a base and the collector of the first transistor, and a second shunt feedback reactance element coupled between a base and the collector of the second transistor.

In an alternative embodiment of the mixer, the mixer includes a first differential amplifier having a common emitter node, a second differential amplifier having a common emitter node, a first output node coupled to a collector of the first differential amplifier, a second output node coupled to a collector of the second differential amplifier, a first transistor having a collector coupled to the common emitter node of the first differential amplifier, a second transistor having a collector coupled to the common emitter node of the second differential amplifier, a shunt feedback reactance element coupled between a base of the first transistor and the first output node, and another shunt feedback reactance element coupled between a base of the second transistor and the second output node.

In an alternative embodiment of the mixer, the mixer is based on a Gilbert cell modified to include a first differential amplifier having a common emitter node, a second differential amplifier having a common emitter node, a first transistor coupled to the common emitter node of the first differential amplifier, a second transistor coupled to the common emitter node of the second differential amplifier, and first and second reactance elements coupled to the respective first and second transistors so that the Gilbert cell has a conversion gain of less that 20 dB and a noise figure of less than 7 dB while operating at an input frequency in a range between 500 MHz and 2,000 MHz.

In an alternative embodiment of the mixer, the mixer is based on a Gilbert cell modified to include a first differential amplifier having a common emitter node, a second differential amplifier having a common emitter node, a first transistor coupled to the common emitter node of the first differential amplifier, a second transistor coupled to the common emitter node of the second differential amplifier, and first and second reactance elements coupled to the respective first and second transistors so that the Gilbert cell has an input compression point of greater than −7 dBm and a noise figure of less than 7 dB while operating at an input frequency in a range between 500 MHz and 2,000 MHz.

In an alternative embodiment of the invention, a method of making a modified Gilbert cell includes providing a first series feedback reactance element coupled between an emitter of a first transistor of the Gilbert cell and a mixer common node, providing a second series feedback reactance element coupled between an emitter of a second transistor of the Gilbert cell and the mixer common node, providing a first shunt feedback reactance element coupled between a base and a collector of the first transistor, and providing a second shunt feedback reactance element coupled between a base and a collector of the second transistor.

In an alternative embodiment of the invention, a method of making a modified Gilbert cell includes providing a first shunt feedback reactance element coupled between a base and a collector of a first transistor of the Gilbert cell, and providing a second shunt feedback reactance element coupled between a base and a collector of a second transistor of the Gilbert cell.

In an alternative embodiment of the invention, a method of making a modified Gilbert cell includes providing a shunt feedback reactance element coupled between a base of a first transistor of the Gilbert cell and an output node of the Gilbert cell, and providing another shunt feedback reactance element coupled between a base of a second transistor of the Gilbert cell and another output node of the Gilbert cell.

By applying a combination of one or two levels of shunt feedback reactance with our without series feedback reactances, the input compression point can be improved while maintaining the noise figure below an acceptable maximum levels and without sacrificing the input return loss (e.g., VSWR).

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention applies reactive feedback networks to a four quadrant multiplier used as a mixer in order to improve the input compression point by lowering the mixer's conversion gain while minimizing any adverse increase in resulting noise figure.

Figure 3:
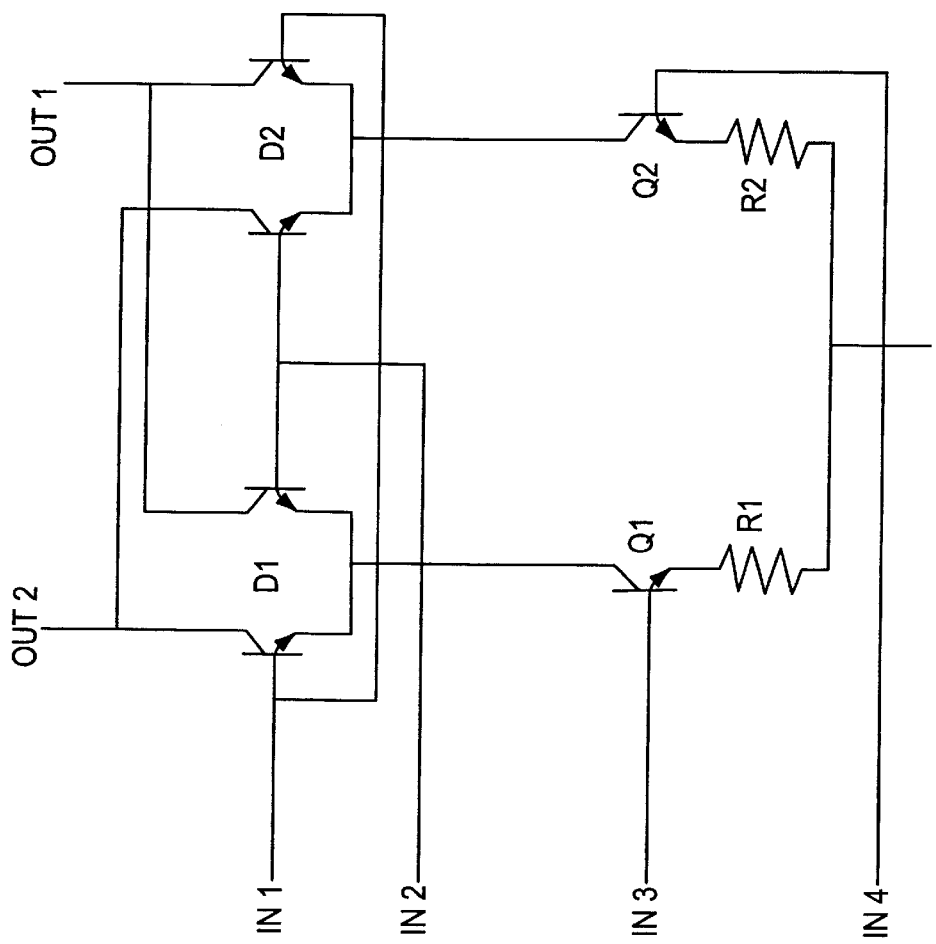
FIG. 3 is a schematic diagram of another known four quadrant multiplier used as a mixer.
Figure 4:
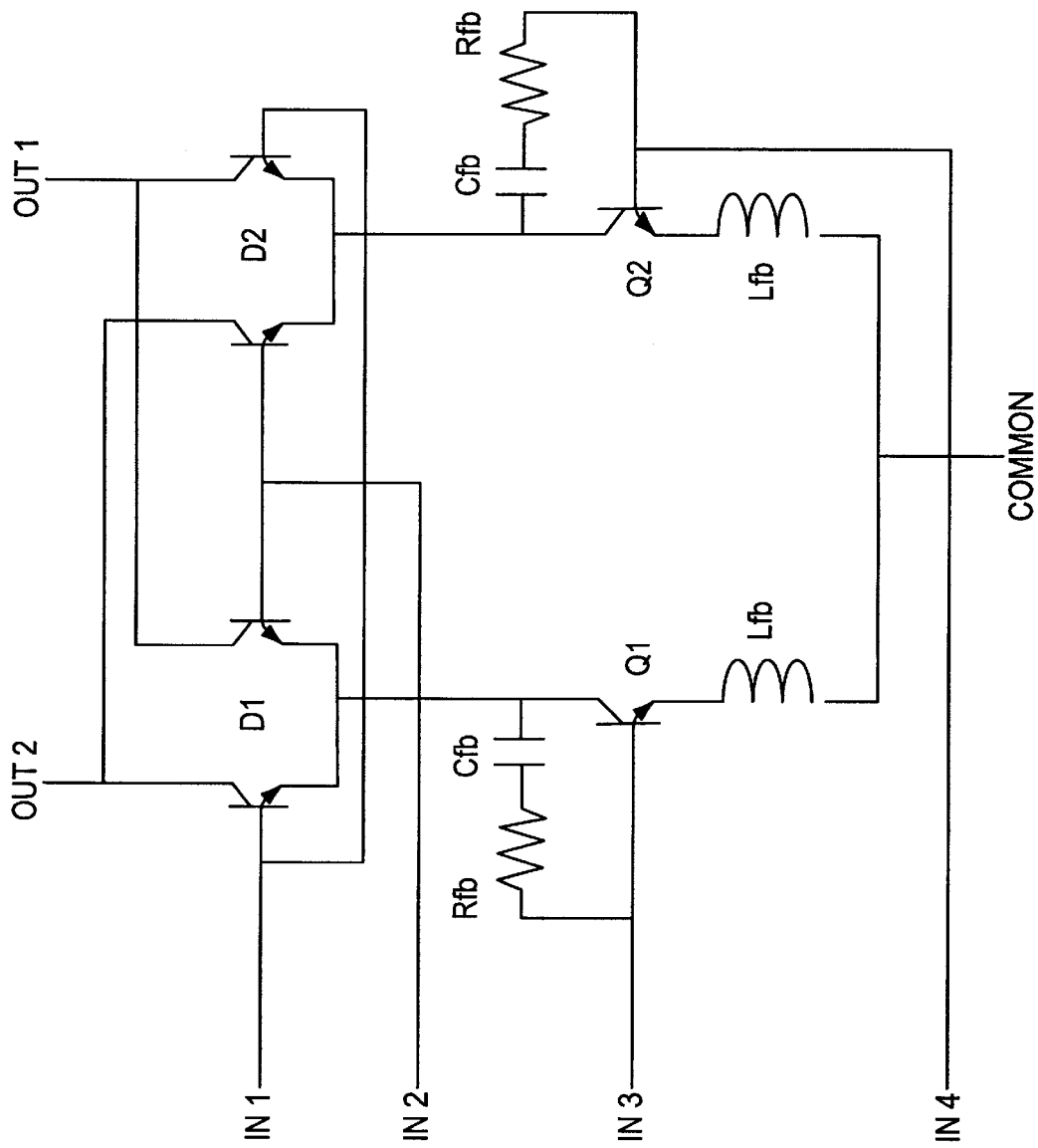
FIG. 4 is a schematic diagram of a four quadrant multiplier used as a mixer with feedback reactance according to the present invention.

FIG. 4 illustrates a four quadrant mixer with two types of feedback networks applied simultaneously. While similar to the mixer of FIG. 3, the mixer of FIG. 4 replaces resistors R1 and R2 with inductors. In FIG. 4, the mixer includes a common node, first and second cross connected differential amplifiers D1 and D2, first and second transistors Q1 and Q2, and first and second feedback inductors Lfb as first and second series feedback reactance elements coupled between an emitter of respective first and second transistors and the mixer common node. Further in FIG. 4, the mixer includes first and second series connected capacitors Cfb and resistors Rfb as respective a first and second shunt feedback reactance elements coupled between a base and a collector of respective first and second transistors. The shunt and series feedback elements work together to lower the conversion gain of the mixer, and thus, improve the input compression point. The amount of feedback is preferably chosen such that the gain is lowered while maintaining a best compromise between input match (i.e., as specified by the S11 parameter or the VSWR parameter) and noise figure.

Figure 1:
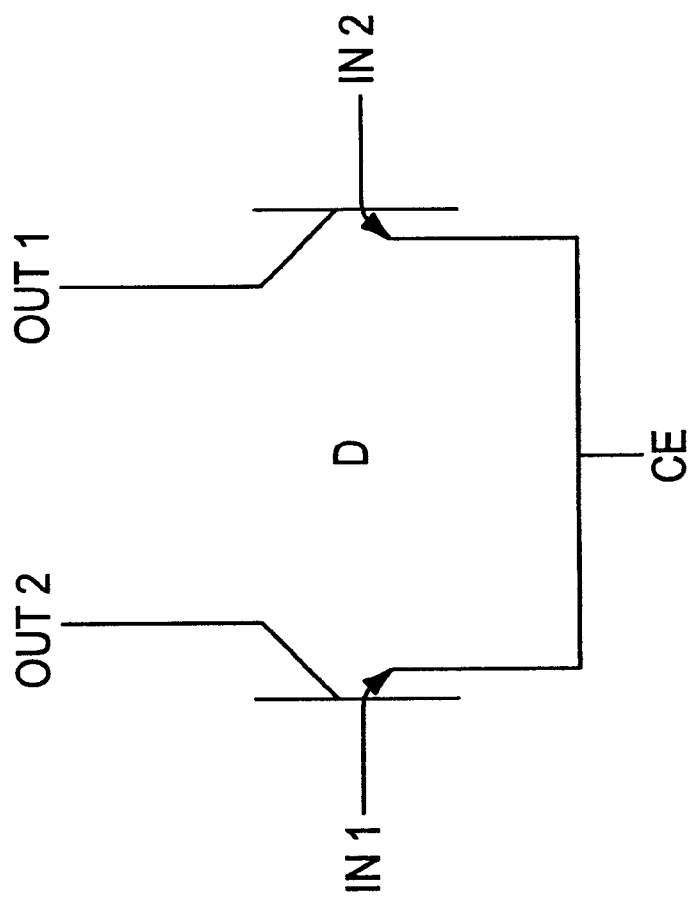
FIG. 1 is a schematic diagram of a known differential amplifier.
Figure 2:
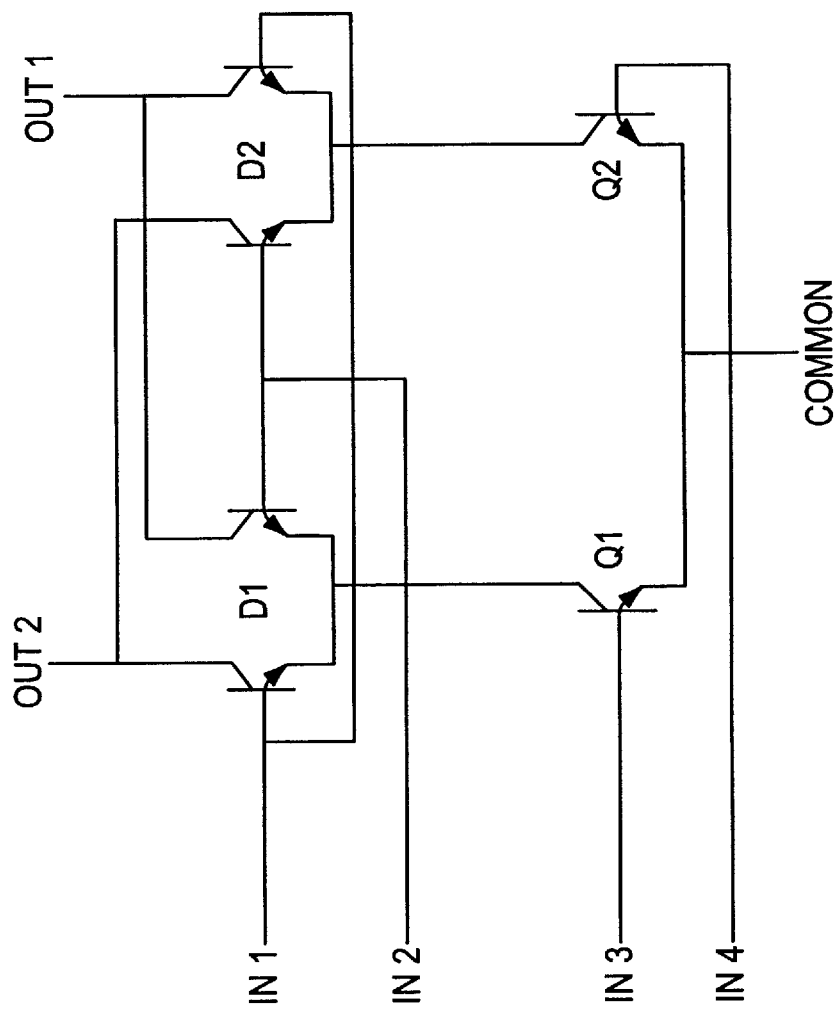
FIG. 2 is a schematic diagram of a known four quadrant multiplier used as a mixer.

Table 1 contains results of computer simulations of the four quadrant multiplier with feedback reactance elements as depicted in FIG. 4 and the known four quadrant multiplier without feedback reactance elements as depicted in FIG. 2, both used as a mixer to down convert a carrier frequency of 1,000 MHz to an IF frequency (intermediate frequency) of 200 MHz. In the simulation of both mixers, transistors Q1 and Q2 were each biased to conduct a bias current of Icc=4.2 milliamperes, and the nominal bias voltage from either of the outputs OUT1 and OUT2 to the mixer common node is biased to Vcc=3 volts. In the mixer of FIG. 4, series feedback inductors had an inductance of Lfb=5 nanohenrys with a Q of 6.5, the shunt feedback capacitors had a capacitance of Cfb=3 picafarads, and the shunt feedback resistors had a resistance of Rfb=40 ohms.

TABLE 1

| Parameter | Without Feedback | With Feedback | Units |
| --- | --- | --- | --- |
| Conversion Gain | 29.8 | 15.4 | dB |
| Noise Figure | 3.5 | 6.7 | dB |
| Input Return Loss | >10 | >10 | dB |
| Input Compression Point | −24 | −10 | dBm |

With the mixer depicted in FIG. 4, the conversion gain can be further reduced by increasing the amount of series feedback inductance Lfb and the resulting input compression point will be further increased. However, the noise figure will exceed desired or specification levels unless the inductor Q is high.

Figure 5:
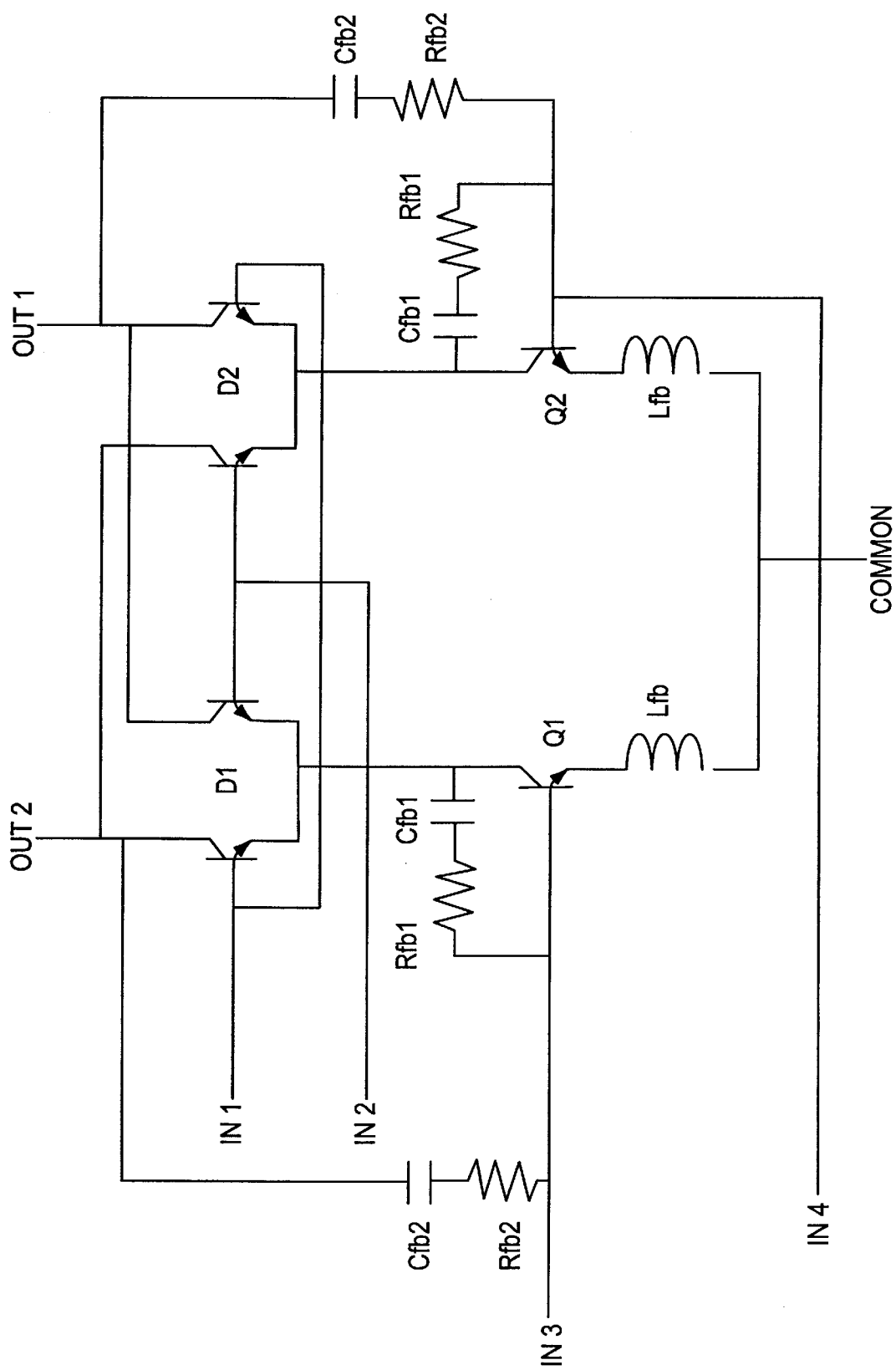
FIG. 5 is a schematic diagram of another four quadrant multiplier used as a mixer with feedback reactance according to the present invention.

To further improve the mixer depicted in FIG. 4, a shunt feedback resistor and shunt feed back capacitor is added between the mixer outputs and the inputs to transistors Q1 and Q2. In FIG. 5, a series connection of shunt feedback capacitor Cfb2 and shunt feedback resistor Rfb2 is added to the mixer depicted in FIG. 4 as a third shunt reactance element coupled between the base of first transistor Q1 and first output node OUT1 of the mixer. Also in FIG. 5, a series connection of shunt feedback capacitor Cfb2 and shunt feedback resistor Rfb2 is added to the mixer depicted in FIG. 4 as a fourth shunt reactance element coupled between the base of the second transistor Q2 and second output node OUT1 of the mixer.

Table 2 contains results of computer simulations of the four quadrant multiplier with top feedback reactance elements as depicted in FIG. 5 and the four quadrant multiplier without top feedback reactance elements, but with lower feedback reactance elements, as depicted in FIG. 4, both used as a mixer to down convert a carrier frequency of 1,000 MHz to an IF frequency (intermediate frequency) of 200 MHz.

TABLE 2

| Parameter | Without Top Feedback | With Top Feedback | Units |
| --- | --- | --- | --- |
| Conversion Gain | 15.4 | 10.3 | dB |
| Noise Figure | 6.7 | 7.0 | dB |
| Input Return Loss | >10 | >10 | dB |
| Input Compression Point | −10 | −6.5 | dBm |

In the simulation of both mixers, transistors Q1 and Q2 were each biased to conduct a bias current of Icc=4.2 milliamperes, and the nominal bias voltage from either of the outputs OUT1 and OUT2 to the mixer common node is biased to Vcc=3 volts. In the mixer of FIG. 4, series feedback inductors had an inductance of Lfb=5 nanohenrys with a Q of 6.5, the first shunt feedback capacitors (i.e., inner capacitors) had a capacitance of Cfb1=3 picafarads, and the first shunt feedback resistors (i.e., inner resistors) had a resistance of Rfb1=40 ohms. The second shunt feedback capacitors (i.e., outer capacitors) had a capacitance of Cfb2=0.25 picafarads, and the second shunt feedback resistors (i.e., outer resistors) had a resistance of Rfb2=500 ohms.

By applying a combination of two levels of shunt feedback reactance in combination with series feedback reactance, the input compression point can be improved while maintaining the noise figure below an acceptable maximum levels and without sacrificing the input return loss (e.g., VSWR).

Having described preferred embodiments of a novel mixer (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by letters patent is set forth in the appended claims.

What is claimed is:

1. A mixer comprising:
   a mixer common node;
   a first differential amplifier having a common emitter node;
   a second differential amplifier having a common emitter node, the second differential amplifier cross connected with the first differential amplifier;

a first transistor having a collector coupled to the common emitter node of the first differential amplifier;

a second transistor having a collector coupled to the common emitter node of the second differential amplifier;

a first series feedback reactance element coupled between an emitter of the first transistor and the mixer common node, the first series feedback reactance element includes an inductor;

a second series feedback reactance element coupled between an emitter of the second transistor and the mixer common node, the second series feedback reactance element includes an another inductor;

a first shunt feedback reactance element coupled between a base and the collector of the first transistor, the first shunt feedback reactance element includes a first resistance-capacitance element; and a second shunt feedback reactance element coupled between a base and the collector of the second transistor, the second shunt feedback reactance element includes a second resistance-capacitance element.

2. The mixer of claim 1, further comprising:

a first output node of the mixer coupled to a first collector of the first differential amplifier, the first collector cross connected with a first collector of the second differential amplifier;

a second output node of the mixer coupled to a second collector of the second differential amplifier, the second collector cross connected with a second collector of the first differential amplifier;

a third shunt feedback reactance element coupled between the base of the first transistor and the second output node of the mixer; and a fourth shunt feedback reactance element coupled between the base of the second transistor and the first output node of the mixer.

3. The mixer of claim 2, wherein:

the third shunt feedback reactance element includes a resistance-capacitance element; and the fourth shunt feedback reactance element includes another resistance-capacitance element.

4. A mixer comprising:

a first differential amplifier having a common emitter node;

a second differential amplifier having a common emitter node, the first differential amplifier cross connected with the second differential amplifier;

a first transistor having a collector coupled to the common emitter node of the first differential amplifier;

a second transistor having a collector coupled to the common emitter node of the second differential amplifier;

a first shunt feedback reactance element coupled between a base and the collector of the first transistor, the first shunt feedback reactance element includes a first resistance-capacitance element; and a second shunt feedback reactance element coupled between a base and the collector of the second transistor, the second shunt feedback reactance element includes a second resistance-capacitance element.

5. The mixer of claim 4, further comprising:

a mixer common node;

a first series feedback reactance element coupled between an emitter of the first transistor and the mixer common node the first series feedback reactance element includes an inductor; and a second series feedback reactance element coupled between an emitter of the second transistor and the mixer common node, the second series feedback reactance element includes another inductor.

6. A mixer comprising:

a first differential amplifier having a common emitter node;

a second differential amplifier having a common emitter node, the second differential amplifier cross connected with the first differential amplifier;

a first output node coupled to a first collector of the first differential amplifier, the first collector cross connected with a first collector of the second differential amplifier;

a second output node coupled to a second collector of the second differential amplifier, the second collector cross connected with a second collector of the first differential amplifier;

a first transistor having a collector coupled to the common emitter node of the first differential amplifier;

a second transistor having a collector coupled to the common emitter node of the second differential amplifier;

a shunt feedback reactance element coupled between a base of the first transistor and the first output node; and another shunt feedback reactance element coupled between a base of the second transistor and the second output node.

7. A modified Gilbert cell comprising:

a first differential amplifier having a common emitter node;

a second differential amplifier having a common emitter node, the second differential amplifier cross connected with the first differential amplifier;

a first transistor coupled to the common emitter node of the first differential amplifier;

a second transistor coupled to the common emitter node of the second differential amplifier; and first and second reactance elements coupled to the respective first and second transistors so that the Gilbert cell has a conversion gain of less than 20 dB and a noise figure of less than 7 dB while operating at an input frequency in a range between 500 MHz and 2,000 MHz.

8. The modified Gilbert cell of claim 7, wherein the Gilbert cell has a conversion gain of less than 12 dB and a noise figure of less than 7 dB while operating at an input frequency in a range between 1,000 MHz and 1,500 MHz.

9. A modified Gilbert cell comprising:

a first differential amplifier having a common emitter node;

a second differential amplifier having a common emitter node the second differential amplifier cross connected with the first differential amplifier;

a first transistor coupled to the common emitter node of the first differential amplifier;

a second transistor coupled to the common emitter node of the second differential amplifier; and first and second reactance elements coupled to the respective first and second transistors so that the Gilbert cell has an input compression point of greater than −7 dBm and a noise figure of less than 7 dB while operating at an input frequency in a range between 500 MHz and 2,000 MHz.

10. The modified Gilbert cell of claim 9, wherein the Gilbert cell has an input compression point greater than −12 dBm and a noise figure of less than 7 dB while operating at an input frequency in a range between 1,000 MHz and 1,500 MHz.

11. A method of making a modified Gilbert cell, a Gilbert cell comprising a first differential amplifier having a first common emitter node and a second differential amplifier having a second common emitter node, the second differential amplifier cross connected with the first differential amplifier, a first transistor coupled to the first common emitter node, a second transistor coupled to the second common emitter node, and a mixer common node, the method of making comprising the steps of:

provided a first series feedback reactance element coupled between an emitter of the first transistor and the mixer common node;

providing a second series feedback reactance element coupled between an emitter of the second transistor and the mixer common node;

providing a first shunt feedback reactance element coupled between a base and a collector of the first transistor, the first shunt feedback reactance element includes a first resistance-capacitance element; and providing a second shunt feedback reactance element coupled between a base and a collector of the second transistor, the second shunt feedback reactance element includes a second resistance-capacitance element.

12. A method of making a modified Gilbert cell, a Gilbert cell comprising a first differential amplifier having a first common emitter node and a second differential amplifier having a second common emitter node, the second differential amplifier cross connected with the first differential amplifier, a first transistor coupled to the first common emitter node, a second transistor coupled to the second common emitter node and a mixer common node, the method of making comprising the steps of:

providing a first shunt feedback reactance element coupled between a base and a collector of the first transistor, the first shunt feedback reactance element includes a first resistance-capacitance element; and providing a second shunt feedback reactance element coupled between a base and a collector of the second transistor, the second shunt feedback reactance element includes a second resistance-capacitance element.

13. A method of making a modified Gilbert cell, a Gilbert cell comprising a first differential amplifier having a first common emitter node and a collector coupled to a first output node, a second differential amplifier having a second common emitter node and a collector coupled to a second output node, the first differential amplifier cross connected with the second differential amplifier, a first transistor coupled to the first common emitter node and a second transistor coupled to the second common emitter node, the method of making comprising the steps of:

providing a shunt feedback reactance element coupled between a base of the first transistor and the first output node; and providing another shunt feedback reactance element coupled between a base of the second transistor and the second output node.

* * * * *